United States Patent
Jiang

[11] Patent Number: 5,844,428
[45] Date of Patent: Dec. 1, 1998

[54] DRIVER CIRCUIT FOR USE WITH A SENSING AMPLIFIER IN A MEMORY

[75] Inventor: Yong H. Jiang, Milpitas, Calif.

[73] Assignee: Integrated Silicon Solution Inc., Santa Clara, Calif.

[21] Appl. No.: 850,716

[22] Filed: May 2, 1997

[51] Int. Cl.$^6$ .......................... G01R 19/00; H03K 3/356
[52] U.S. Cl. .......................... 327/57; 327/108; 327/208
[58] Field of Search .................... 327/51, 55–57, 327/108, 199–203, 210–214, 215–219, 266, 276, 277, 280, 281, 284, 285, 287, 288, 391, 395, 400; 365/189.05, 205, 230.06, 230.08

[56] References Cited

U.S. PATENT DOCUMENTS

| 4,434,381 | 2/1984 | Stewart | 327/57 |
| 5,189,315 | 2/1993 | Akata | 327/212 |

FOREIGN PATENT DOCUMENTS

| 361079318 | 4/1986 | Japan | 327/212 |
| 363067012 | 3/1988 | Japan | 327/212 |

*Primary Examiner*—My-Trang Nu Ton
*Attorney, Agent, or Firm*—Stephen M. Knauer; Flehr Hohbach Test Albritton & Herbert LLP

[57] ABSTRACT

A novel driver circuit is disclosed that is used for driving a logic voltage sensed by a sensing amplifier of a memory onto a data line of the memory. The driver circuit is responsive to first sensing signals and second sensing signals that are delayed with respect to the first sensing signals. When the first and second sensing signals indicate that equalization is occuring in the sensing amplifier, the driver circuit latches the data line logic voltage on the data line without any false transitions or glitches occuring on the data line. In addition, the driver circuit becomes self biased when the first sensing signals indicate that sensing is occuring in the sensing amplifier but the second sensing signals indicate that equalization is still occuring. This is done to minimize the voltage swing in the driver circuit when the sensed logic voltage is driven onto the data line while both the first and second sensing signals indicate that sensing is occuring.

14 Claims, 4 Drawing Sheets

5,844,428

1

DRIVER CIRCUIT FOR USE WITH A SENSING AMPLIFIER IN A MEMORY

The present invention relates generally to driver circuits that are used to drive the data lines of memories with the output of the sensing amplifiers of the memories. In particular, it pertains to a novel driver circuit with increased speed in driving the data line of a memory with the output of a sensing amplifier of the memory without consuming a large amount of power.

BACKGROUND OF THE INVENTION

Differential voltage sensing amplifiers and corresponding driver circuits are commonly used in the memory blocks (or banks) of a memory. When a data word is being read from one of the memory blocks, the memory cell array of the memory block outputs corresponding differential voltages for each bit of the data word. And, in the memory block, there is a corresponding sensing amplifier and a corresponding driver circuit for the corresponding differential voltages for each bit of the data word. The corresponding sensing amplifier for each bit receives and senses the corresponding differential voltages and in response outputs a corresponding sensed logic voltage which identifies the logic value (either high or low) of the bit. The corresponding driver circuit then receives the sensed logic voltage and drives a corresponding data line of the memory with the sensed logic voltage. The memory has a data line for each bit of the data word read from the memory block so that the bits of the data word are provided and made available on the data lines of the memory.

FIGS. 1 and 2 shows a conventional differential sensing amplifier 100 and a conventional driver circuit 108 for use in a memory block of a memory. The memory cell array of the memory block outputs corresponding differential voltages for each bit of a data word that is being read from the memory block. The sensing amplifier 100 receives the differential voltages for a corresponding bit of the data word at its input terminals IO and IOB and senses the differential voltages so as to output a corresponding sensed logic voltage at its output terminal SL which identifies the logic value of the bit. The driver circuit 108 then receives the sensed logic voltage at its input terminal SL and drives a corresponding data line of the memory with the sensed logic voltage at its output terminal DQ.

Referring to FIG. 1, the conventional sensing amplifier 100 includes a sensing stage 102 and a sensing and logic conversion stage 104. The sensing stage 102 has input terminals IO and IOB that are coupled to the memory array cell of the corresponding memory block. In general, the sensing stage 102 receives corresponding input differential voltages at its input terminals IO and IOB for a bit of a data word which are output by the memory cell array of the memory block when a data word is being read from the memory block. The sensing stage 102 senses the input differential voltages and in response outputs sensed differential voltages at its output terminals SO and SOB. The input terminals SO and SOB of the sensing and logic conversion stage 104 are coupled to the output terminals SO and SOB of the sensing stage 102. Thus, the sensing and logic conversion stage 104 receives the sensed differential voltages at its input terminals SO and SOB and then converts them to a sensed logic voltage at its output terminal SL that identifies the logic value of the bit.

More specifically, internal control circuits generates a sense enable signal LSAE that indicates whether the sensing

2 amplifier 100 is enabled or disabled for sensing the input differential voltages at its input terminals IO and IOB. The sensing stage 102 and the sensing and logic conversion stage 104 respectively include transistors MNS1 and MNS4 that are responsive to the sense enable signal LSAE.

When the sense enable signal LSAE is high, it indicates that the sensing amplifier 100 is enabled for sensing. In this case, the transistor MNS1 is turned on so that the transistors MP1, MP2, MP3, MP4, MN1, MN2, MN3, and MN4 of the sensing stage are turned on and the sensing stage is enabled for sensing the input differential voltages at its input terminals IO and IOB to produce sensed differential voltages at its output terminals SO and SOB. Similarly, the transistor MNS4 is turned on so that the transistors MP9, MP10, MN9, and MN10 of the sensing and logic conversion stage are turned on and the sensing and logic conversion stage 104 is enabled from converting the sensed differential voltages at its input terminals SO and SOB to a sensed logic voltage at its output terminal SL.

However, the sense enable signal LSAE indicates that the sensing amplifier 100 is not enabled for sensing when it is low. In this case, the transistor MNS1 is turned off so that the transistors MN1, MN2, MN3, and MN4 of the sensing stage are turned off and the sensing stage is disabled from sensing the input differential voltages at its input terminals IO and IOB to produce the sensed differential voltages at its output terminals SO and SOB. Similarly, the transistor MNS4 is turned off so that the transistors MN9 and MN10 of the sensing and logic conversion stage are turned off and the sensing and logic conversion stage 104 is disabled from converting the differential voltages at its input terminals SO and SOB to a sensed logic voltage at its output terminal SL.

Furthermore, when a data word is not being read from the memory block, the sense enable signal LSAE will be low and indicate that the sensing amplifier 100 has not been enabled. And, when a data word is being read from the memory block, the sense enable signal LSAE will be high and indicate that the sensing amplifier 100 has been enabled for equalization and sensing to occur. This is done to conserve power consumption by the sensing amplifier 100.

The internal control circuits also generate an inverted sensing signal LEQSB that indicates that equalization is occurring when it is low and indicates that sensing is occurring when it is high. The internal control circuits include a sensing signal generating circuit 106 that has an inverter C8 that inverts the inverted sensing signal LEQSB to generate the non-inverted sensing signal LEQS. It also includes an inverter C9 that inverts the non-inverted sensing signal LEQS to generate the delayed inverted sensing signal LEQSB1. And, it includes an inverter C10 that inverts the delayed inverted sensing signal LEQSB1 to generate the delayed non-inverted sensing signal LEQSB. Thus, the non-inverted and delayed non-inverted sensing signals LEQS and LEQS1 indicate that equalization is occurring when they are high and indicate that sensing is occurring when they are low. Conversely, the delayed inverted sensing signal LEQSB1 indicates that equalization is occurring when it is low and indicates that sensing is occurring when it is high. Moreover, the delayed complementary signals LEQSB1 and LEQS1 are delayed by a two gate delay with respect to the complementary sensing signals LEQSB and LEQS.

The transistors PO and POB of the sensing stage 102 are responsive to the sensing signal LEQSB and the transfer gate TR0 of the sensing stage is responsive to the sensing signals LEQSB and LEQS. Moreover, the transistor P1 of the sensing and logic conversion stage 104 is responsive to the sensing signal LEQSB1.

Thus, when the sense enable signal LSAE transitions from low to high and indicates that the sensing amplifier is enabled, the sensing signals LEQSB and LEQSB1 will be low and the sensing signals LEQS and LEQS1 will be high and therefore indicate that equalization is occurring. In this case, the transistors MNS1, MP1, MP2,.MP3, MP4, MN1, MN2, MN3, and MN4 of the sensing stage 102 will be turned on. Moreover, the transistors PO and POB and the transfer gate TR0 of the sensing stage will also be turned on. As a result, the differential voltages at the output terminals SO and SOB of the sensing stage 102 and the input terminals SO and SOB of the sensing and logic conversion stage 104 and the voltages at the nodes N1 and N2 of the sensing stage 102 will be the same and will therefore be equalized. Similarly, the transistors MNS4, MP9, MP10, MN9, MN10, and P1 of the sensing and logic conversion stage 104 will be turned on so that the voltage at the output terminal SL and the voltage at the node N3 of the sensing and logic conversion stage 104 will be equalized. This minimizes the voltage swings at the nodes N1, N2, and N3 and the output and input terminals SO and SOB of the sensing and sensing and logic conversion stages during sensing so as to increase the speed of sensing by the sensing amplifier 100 after equalization.

Once equalization has occurred, the LSAE remains high and indicates that the sensing amplifier is enabled and the sensing signals LEQSB and LEQSB1 will transition from low to high and the sensing signals LEQS and LEQS1 will transition from high to low and therefore indicate that sensing is occurring. In this case, the transistors MNS1, MP1, MP2, MP3, MP4, MN1, MN2, MN3, and MN4 of the sensing stage 102 will be turned on but the transistors PO and POB and the transfer gate TR0 of the sensing stage will be turned off. As a result, the input differential voltages at the input terminals IO and IOB of the sensing stage 102 will be sensed as sensed differential voltages at the output terminals SO and SOB of the sensing stage 102. Furthermore, the transistors MNS4, MP9, MP10, MN9, and MN10 will be turned on but the transistor P1 will be turned off. Thus, the sensed differential voltages will be provided to the input terminals SO and SOB of the sensing and logic conversion stage 104 which then converts them into a sensed logic voltage at its output terminal SL.

FIG. 2 shows the conventional driver circuit 108. The output terminal SL of the sensing and logic conversion stage 104 is coupled to the input terminal SL of the driver circuit 108 for receiving the sensed logic voltage. Thus, during sensing by the sensing amplifier 100, the driver circuit 108 receives the sensed logic voltage and drives a corresponding data line of the memory with a voltage at the output terminal DQ which is logically the same as the sensed logic voltage and identifies the logic value of the corresponding bit of the data word being read from the memory block.

More specifically, the driver circuit 108 includes an input transfer gate TR1 that is coupled between the input terminal SL and the node N4 of the driver circuit 108 with its input and output terminals respectively coupled to the input terminal SL and the node N4. The transfer gate TR1 is coupled to the inverter gates C9 and C10 of the sensing signal generating circuit 106 for respectively receiving the sensing signals LEQSB1 and LEQS1.

The driver circuit 108 also includes latching inverter gates C5 and C6 that are coupled in parallel between the nodes N4 and N5 of the driver circuit 108. The latching inverter gates C5 and C7 form a latch of the driver circuit 108 with the input and output terminals of the inverter gate C5 being respectively coupled to the nodes N4 and N5 of the driver circuit 108 and the input and output terminals of the inverter gate C6 being respectively coupled to the nodes N5 and N4.

The driver circuit 108 further includes a driving inverter gate C7 that is coupled between the nodes N5 and N6. The driving inverter gate C7 has its input and output terminals respectively coupled to the nodes N5 and N6.

And finally, the driver circuit 108 includes an output transfer gate TR2 that is coupled between the node N6 and the output terminal DQ of the driver circuit with the input and output terminals of the output transfer gate being respectively coupled to the node N6 and the output terminal DQ. The output transfer gate receives noninverted and inverted memory block control signals BLK and BLKB from the internal control circuits.

Thus, when the sensing signals LEQSB1 and LEQS1 are respectively high and low and indicate that equalization is occurring, the input transfer gate TR1 is turned off. This prevents the voltage at the input terminal SL of the driver circuit from being passed to the node N4.

But, when the sensing signals LEQSB1 and LEQS1 are low and high respectively and indicate that sensing is occurring, the input transfer gate TR1 is turned on and passes the sensed logic voltage at the input terminal SL to the node N4. Then, this sensed logic voltage is received, inverted, and latched by the latch formed by the inverter gates C5 and C6 so that the voltage at the node N5 is logically inverted from the sensed logic voltage at the node N4 and identifies the inverted logic value of that identified by the sensed logic voltage. The driving inverter gate C7 then receives and logically inverts the inverted sensed logic voltage at the node N5 so that the voltage at the node N6 is the sensed logic voltage. Since a data word is being read from the corresponding memory block, the memory block control signals BLK and BLKB will be high and low respectively so that the output transfer gate TR2 will be turned on and pass the sensed logic voltage to the output terminal DQ. As a result, the corresponding data line of the memory will be driven with the sensed logic voltage so that the corresponding bit of the data word will be provided and made available on the data line and have the logic value identified by the sensed logic voltage.

Then, when sensing by the sensing amplifier 100 is over, the sensing signals LEQS1 and LEQSB1 will be respectively high and low so that the transfer gate TR1 is turned off. As a result, the transfer gate TR1 no longer passes the sensed logic voltage at the input terminal SL to the node N4. However, as indicated earlier, the sensed logic voltage at the node N4 will be latched by the latch formed by the inverter gates C5 and C6. Thus, the voltage at the output terminal DQ will still be the sensed logic voltage while the output transfer gate TR2 is still turned on. Then, when the reading of the data word from the corresponding memory block is completed, the memory block control signals BLK and BLKB will be respectively low and high and the output transfer gate TR2 will be turned off but the sensed logic voltage will still be latched by the latch formed by the inverter gates C5 and C6 so that voltage at the node N6 will still be the sensed logic voltage. Then, when another data word is being read from the memory block, the memory block control signals BLK and BLKB will be respectively high and low and the output transfer gate TR2 will be turned on and the latched sensed logic voltage will again be passed to the output terminal DQ and driven onto the corresponding data line. However, this may cause false transitions or glitches in the voltage on the data line.

More specifically, as indicated earlier, the memory has a data line for each bit of a data word that is read from a memory block. Thus, in a memory with multiple memory blocks, each data line will be coupled to a corresponding driver circuit 108 of each memory block. As a result, when a data word is being read from a first memory block, the memory block control signals BLK and BLKB will be respectively high and low so that the output transfer gate TR2 of the driver circuit 108 of the first memory block is turned back on again and the latched sensed logic voltage at the node N6 is passed to the output terminal DQ and driven onto the corresponding data line. But, the sensed logic voltage on the data line that was driven earlier onto the corresponding data line by the driver circuit 108 of a second memory block in the same manner as was just described may be different from the sensed logic voltage that is currently being driven onto the data line by the driver circuit 108 of the first memory block. This unfortunately may cause unwanted false transitions or glitches in the voltage on the data line.

Furthermore, when sensing occurs again by the corresponding sensing amplifier 100, the sensing signals LEQSB1 and LEQS will respectively be low and high and the sensed logic voltage at the input terminal SL of the driver circuit 108 will be passed to the node N4, latched at the node N4, and output at the output terminal DQ. This occurs over a two gate delay caused by the inverter gates C5 and C7.

SUMMARY OF THE INVENTION

In summary, the present invention is a driver circuit for use with a sensing amplifier in a memory. The driver circuit comprises an input terminal for coupling to the sensing amplifier and for receiving a sensed logic voltage from the sensing amplifier, an output terminal for coupling to a data line of the memory, and a first node and a second node.

The driver circuit also comprises an input transfer gate that is coupled between the input and the first node and is responsive to second sensing signals that are delayed with respect to first sensing signals. The second sensing signals and the second sensing signals indicating when sensing is occurring in the sensing amplifier. The input transfer gate passes the sensed logic voltage from the input to the first node when the first sensing signals indicate that sensing is occurring and does not pass the input signal from the input to the node when the second sensing signals do not indicate that sensing is occurring.

In one embodiment, the driver circuit further comprises a self biasing inverter circuit that is coupled between the first and second nodes and is responsive to the second sensing signals and the first sensing signals. The self biasing inverter circuit biases the first node to a biased voltage while biasing is occurring. Biasing occurs while the first sensing signals indicate that sensing is occurring and the second sensing signals do not indicate that sensing is occurring. The self biasing inverter circuit no longer biases the first node to the bias voltage after biasing has occurred. This is when the second sensing signals indicate that sensing is occurring. As a result, the first node moves from the biased voltage to the sensed logic voltage after biasing when the input transfer gate passes the sensed logic voltage to the first node. The self biasing inverter circuit then inverts the sensed logic voltage at the first node to an inverted logic voltage at the second node after biasing.

The driver circuit yet further comprises a driving inverter gate that is coupled between the second node and the output terminal. It inverts the inverted logic voltage at the second node back to the sensed logic voltage at the output after biasing for driving the data line with the sensed logic voltage.

In another embodiment, the driver circuit comprises a first inverter gate that is coupled between the first and second nodes and an output transfer gate that is coupled between the third node and the output terminal and is responsive to memory block control signals. It also comprises a latching loop that is coupled between the output terminal and the first node and is responsive to the second sensing signals.

In this embodiment, when the first and second sensing signals indicate that sensing is occuring and the memory block control signals indicate that a data word is being read from the memory block, the input transfer gate passes the sensed logic voltage from the input to the first node, the latching loop de-couples the output terminal from the first node, the first inverter gate inverts the sensed logic voltage at the first node to an inverted logic voltage at the second node, the second inverter gate inverts the inverted logic voltage at the second node back to the sensed logic voltage, the output transfer gate passes the sensed logic voltage from the third node to the output terminal so that the second inverter gate drives the sensed logic voltage at the output terminal onto the data line.

And, when the first and second sensing signals indicate that sensing is not occuring and the memory block control signals indicate that a data word is being read from the memory block, the input transfer gate no longer passes the sensed logic voltage from the input to the first node, the latching loop couples the output terminal to the first node and passes the data line logic voltage at the output terminal and on the data line to the first node, the first inverter gate inverts the data line logic voltage at the first node to an inverted logic voltage at the second node, the second inverter gate inverts the inverted logic voltage at the second node back to the data line logic voltage, the output transfer gate passes the data line logic voltage from the third node to the output terminal so that the second inverter gate drives the data line logic voltage at the output terminal onto the data line.

DETAILED DESCRIPTION OF THE INVENTION

Figure 1:
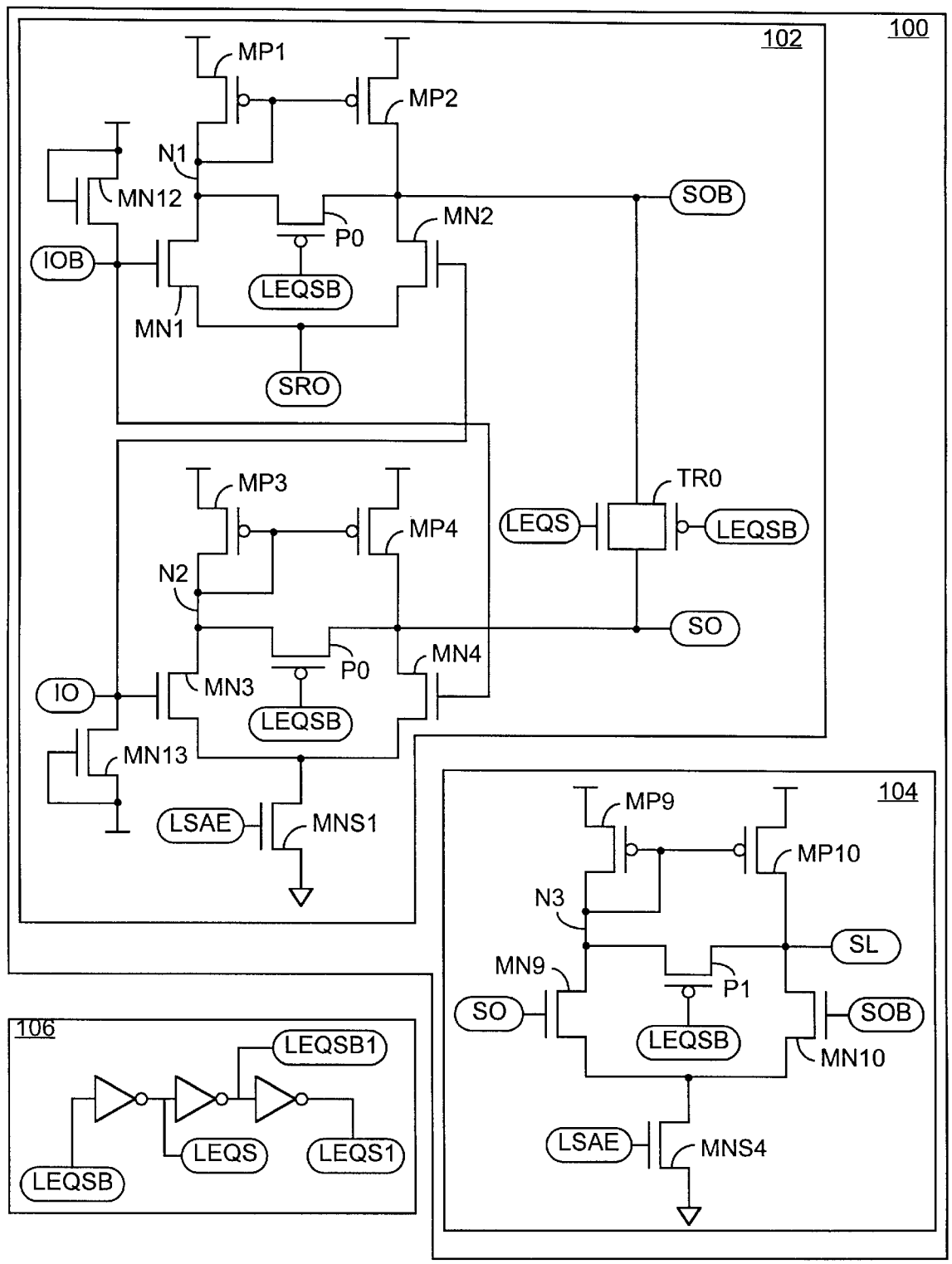
FIG. 1 is a circuit schematic diagram of a conventional sensing amplifier.
Figure 2:
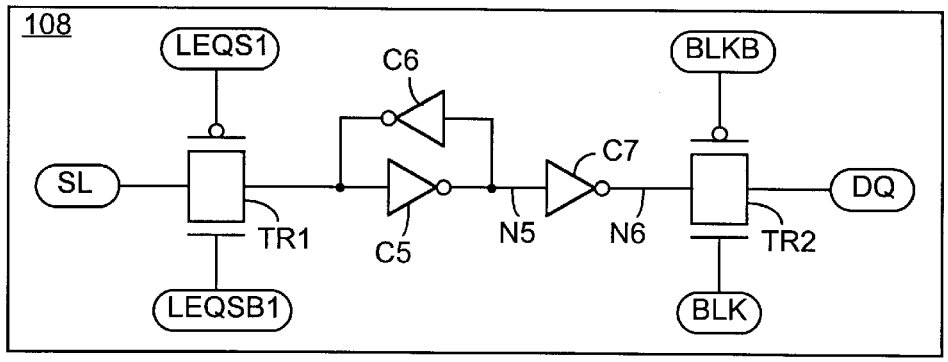
FIG. 2 is a circuit schematic diagram of a conventional driver circuit for use with the conventional sensing amplifier of FIG. 1.
Figure 3:
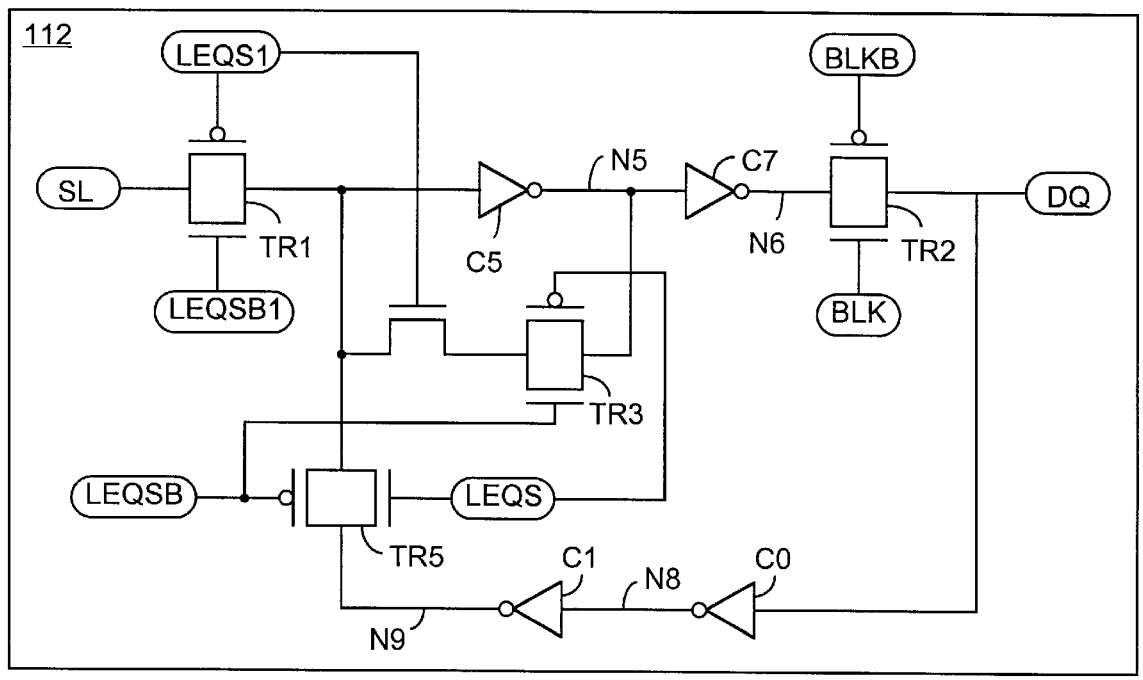
FIG. 3 is a circuit schematic of a novel driver circuit for use with the conventional sensing amplifier of FIG. 1.

FIG. 3 shows a novel driver circuit 112 for use with the corresponding conventional differential sensing amplifier 100 described earlier in a memory block of a memory. As was described earlier, when a data word is being read from the memory block, the memory cell array of the memory block outputs corresponding differential voltages for each bit of the data word. The sensing amplifier 100 receives the differential voltages for a corresponding bit of the data word at its input terminals IO and IOB and senses the differential voltages so as to output a corresponding sensed logic voltage at its output terminal SL which identifies the logic value of the bit. The driver circuit 112 then receives the sensed logic voltage at its input terminal SL and drives a corresponding data line of the memory with the sensed logic voltage at its output terminal DQ.

The conventional sensing amplifier 100 is configured and operates in the manner described earlier. And, the novel driver circuit 112 is configured and operates similar to the driver circuit 108 except that it does not include the inverter gate C6 and instead includes a self biasing inverter circuit 114 for biasing the node N4 and a latching loop 116 for latching the voltage at the output terminal DQ.

The self biasing inverter circuit 114 is coupled between the nodes N5 and N4. It includes the inverter gate C5 discussed earlier. Moreover, it includes a transfer loop 115 that is coupled between the nodes N4 and N5 and comprises a full transfer gate TR3 and a half transfer gate TR4. The full transfer gate TR3 has input and output terminals that are respectively coupled to the node N5 and the node N7 of the self biasing inverter circuit 114. The full transfer gate TR3 is coupled to the internal control circuits for receiving the sensing signals LEQSB and LEQS. And, the half transfer gate TR4 has input and output terminals that are respectively coupled to the nodes N7 and N4. The half transfer gate TR4 is coupled to the internal control circuits for receiving the sensing signal LEQS1.

Figure 4:
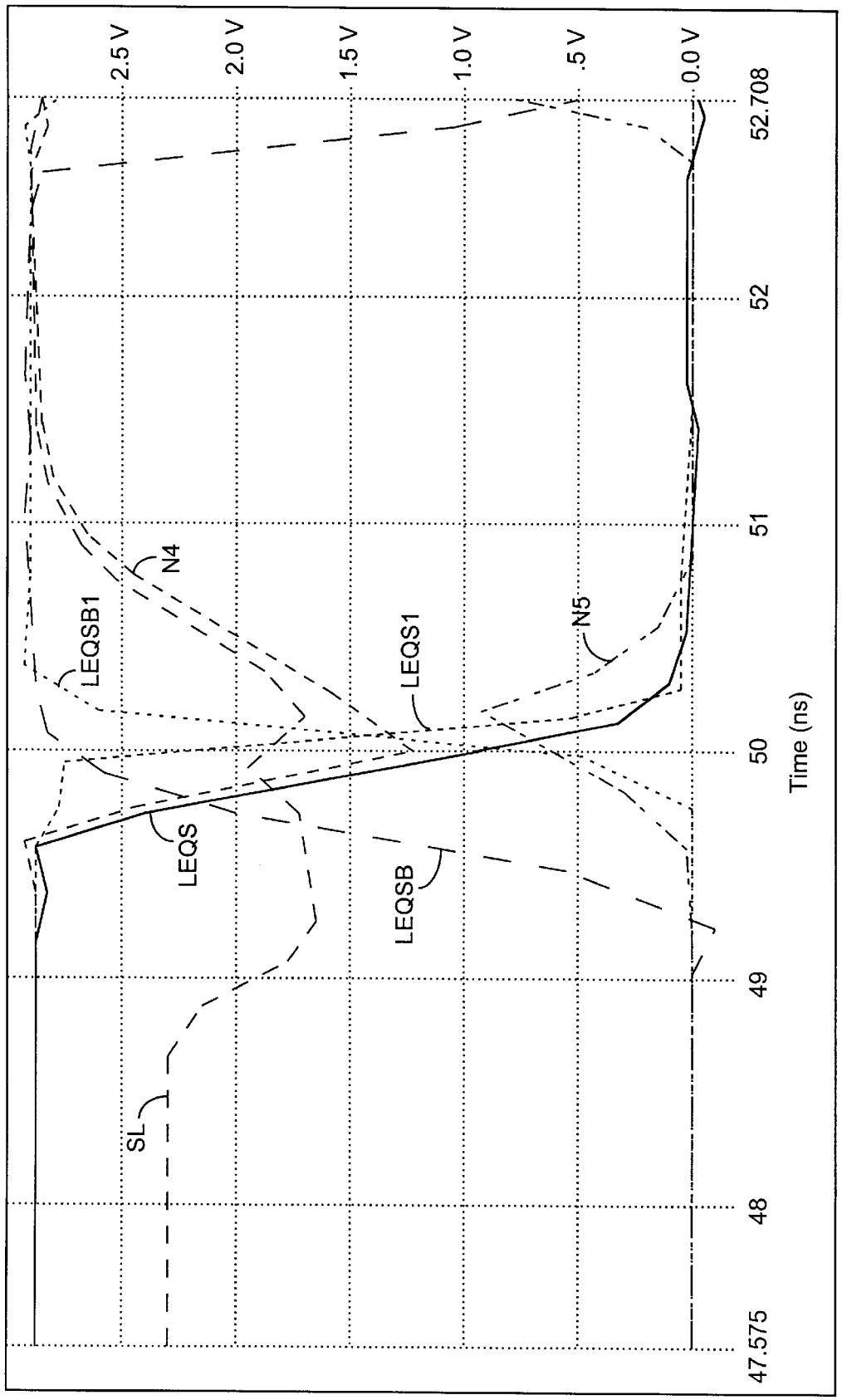
FIGS. 4 and 5 are timing diagrams of the operation of the novel driver circuit of FIG. 3.
Figure 5:
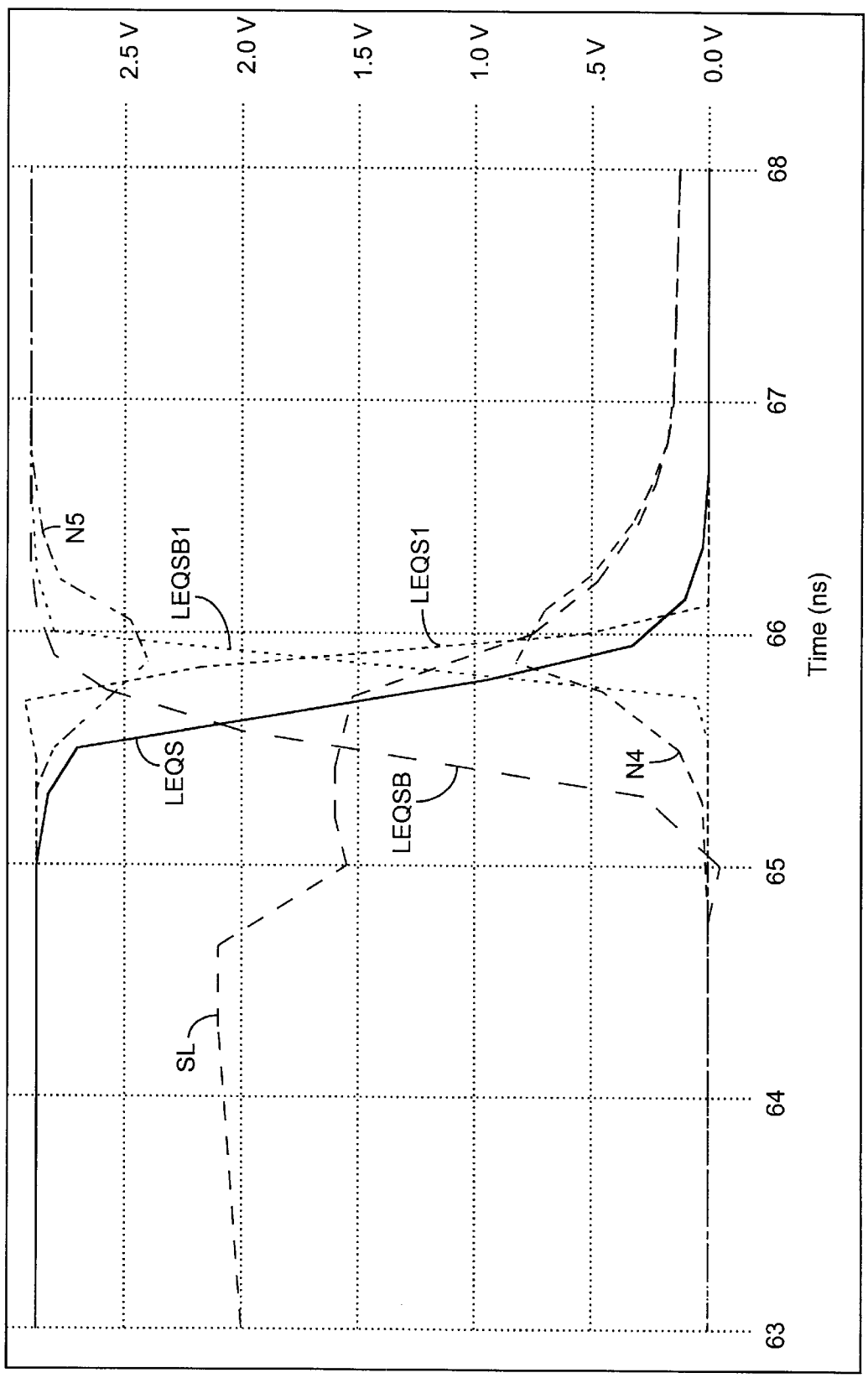

Referring also to the timing diagrams in FIGS. 4 and 5, when a data word is being read from the memory block, the sense enable signal LSAE will be high. And, during equalization, the sensing signals LEQSB and LEQS will be respectively low and high and the delayed sensing signals LEQSB1 and LEQS1 will be respectively low and high. As a result, the input transfer gate TR1 will be turned off and the latching transfer gate TR5 of the latching loop 116 will be turned on so that the data line logic voltage at the output terminal DQ from the corresponding data line that it is coupled to will be passed to the node N4 and latched, as will be described later.

But, when sensing starts, the sensing signals LEQSB and LEQS respectively transition from low to high and high to low while the delayed sensing signals LEQSB1 and LEQS1 are respectively still low and high. As a result, the input transfer gate TR1 will still be turned off and the transfer gate TR5 of the latching loop 116 will also be turned off. But, the full and half transfer gates TR3 and TR4 of the self biasing transfer loop 115 will be turned on so that the output terminal of the inverter gate C5 of the self biasing inverter circuit 114 will be directly coupled to and shorted to the input terminal of the inverter gate C5. In other words, the node N5 will be directly coupled to the node N4. This will bias the node N4 to a selectable bias voltage.

Figure 6:
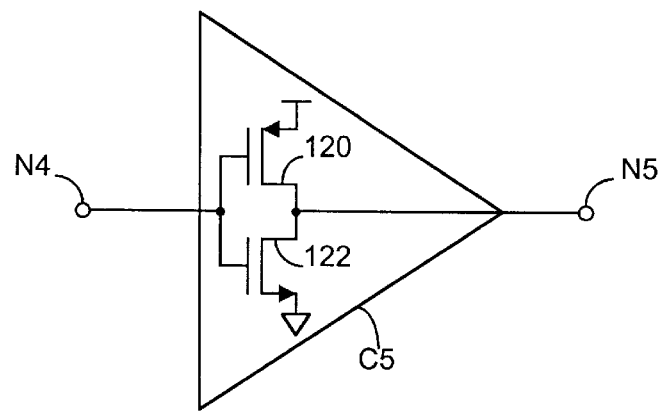
FIG. 6 is a circuit schematic of an inverter gate of the novel driver circuit of FIG. 3.

Referring to FIG. 6, the inverter gate C5 comprises a P transistor 120 and an N transistor 122. The bias voltage is based on the ratio of the sizes of the P transistor 120 and an N transistor 122. For example, the bias voltage can be selected to be approximately ½ VCC by selecting the sizes of the P and N transistors to be respectively 10 $\mu$m and 7 $\mu$m.

Referring back to FIGS. 3 to 5, when the delayed sensing signals LEQSB1 and LEQS1 respectively transition from low to high and high to low, the input transfer gate TR1 will be turned on and the half transfer gate TR4 of the transfer loop 115 will be turned off. As a result, the node N5 will be de-coupled from the node N4 so that the output terminal of the inverter gate C5 of the self biasing inverter circuit 114 will no longer be directly coupled to and shorted to the input terminal of the inverter gate C5. And, as indicated earlier, the sensed logic voltage at the input terminal SL will be passed to the node N4 by the input transfer gate TR1. Since the node N4 will be biased at this point to the bias voltage, the voltage swing at the node N4 from the bias voltage to the sensed logic voltage is minimal in comparison to that discussed earlier for the conventional driver circuit 108.

In FIG. 4, this is shown for the case in which the voltage at the node N4 is latched before sensing occurs by the latching loop 116 to a data line logic voltage at the output terminal DQ which identifies a high logic value. In this case, the sensed logic voltage at the input terminal SL is high. Conversely, FIG. 5 shows the case where the sensed logic voltage at the input terminal SL is high as well but the voltage at the node N4 is latched by the latching loop 116 before sensing to a data line logic voltage at the output terminal DQ that identifies a low logic value. From FIGS. 4 and 5, it is clear that the speed at which this voltage swing occurs is reduced so that the speed at which the sensed logic voltage at the node N4 is inverted by the inverter gate C5 is also reduced. This decreases the gate delay caused by the inverter gate C5 and increases the overall speed at which the sensed logic voltage is driven onto the data line at the output terminal DQ to less than two gate delays.

Moreover, as is clear from the foregoing, this biasing of the node N4 occurs when the sensing signals LEQSB and LEQS respectively transition from low to high and high to low while the delayed sensing signals LEQSB1 and LEQS1 are respectively still low and high and continues until the delayed sensing signals LEQSB1 and LEQS1 respectively transition from low to high and high to low. Since the delayed sensing signals LEQSB1 and LEQS1 are respectively delayed with respect to the sensing signals LEQSB and LEQS for a two gate delay, as mentioned earlier, the biasing of the node N4 occurs over this two gate delay. As a result of the short time over which biasing occurs, the power consumption by the inverter gates C5 and C7 is small as evidenced in FIGS. 4 and 5 from the voltage at the node N5 being relatively unchanged during biasing.

In alternative embodiment, rather than using the half transfer gate TR4, a full transfer gate can be used instead. In this case, the full transfer gate would be coupled to the internal control circuits for receiving both the sensing signals LEQS1 and LEQSB1.

Referring back to FIG. 3, the driver circuit 112 includes a unique latching loop 116, as briefly mentioned earlier. The latching loop 116 is coupled between the output terminal DQ and the node N4. It includes latching inverter gates C1 and C0 which are coupled in series between the node N8 of the latching loop and the output terminal DQ and a latching transfer gate TR3 which is coupled between the nodes N8 and N4. The input and output terminals of the inverter gate C0 are respectively coupled to the output terminal DQ and the node N7 of the latching loop. The input and output terminals of the inverter gate C1 are respectively coupled to the nodes N7 and N8. And, the input and output terminals of the latching transfer gate TR5 are respectively coupled to the nodes N8 and N4. Furthermore, the latching transfer gate TR5 is responsive to the sensing signals LEQSB and LEQS.

As indicated earlier, when a data word is being read from the memory block, the memory block control signals BLK and BLKB are respectively high and low and indicate that the data word is being read from this memory block. Then, when the sensing signals LEQSB and LEQS respectively transition from low to high and high to low to indicate that sensing is occuring, the latching transfer gate TR5 is turned off and de-couples the output terminal DQ from the node N4. Then, as described earlier, the sensed logic voltage at the input terminal SL of the driver circuit 112 is driven onto the data line at the output terminal DQ of the driver circuit 112.

Moreover, when the memory block control signals BLK and BLKB still are respectively high and low and indicate that the data word is still being read from the memory block, the sensing signals LEQSB and LEQS will respectively transition from high to low and low to high to indicate that equalization is occuring. When this happens, the latching transfer gate TR5 is turned on and couples the output terminal DQ to the node N4. The delayed sensing signals LEQSB1 and LEQS1 will then also respectively transition from high to low and low to high to indicate that equalization is occuring. As a result, the input transfer gate TR1 is turned off and no longer passes the sensed logic voltage to the node N4. However, since the voltage at the output terminal DQ and on the data line is still the sensed logic voltage, this sensed logic voltage is logically inverted by the inverter gate C0 so that the voltage at the node N8 identifies the inverted logic value of that identified by the sensed logic voltage. Then, the inverted logic voltage at the node N8 is logically inverted by the inverter gate C1 to the sensed logic voltage. Since the latching transfer gate TR5 is turned on, this sensed logic voltage is passed to the node N4. From there, it is passed onto the node N6 in the same way as was discussed earlier, but without biasing of the node N4. As a result, the sensed logic voltage is latched by the latch formed by the latching loop 116, the inverter gates C5 and C7, and the output transfer gate TR2.

After this data word has been read from the memory block, the sensing signals LEQSB and LEQS are respectively low and high and the delayed sensing signals LEQSB1 and LEQS1 are also respectively low and high so that they indicate that equalization is occurring again. Moreover, the memory block control signals BLK and BLKB are respectively low and high to indicate that a data word is not being read from this memory block. Thus, the input transfer gate TR1 is turned off, the latching transfer gate TR5 is turned on, and the output transfer gate TR2 is off. As a result, the voltage at the output terminal DQ is the data line logic voltage on the data line to which it is coupled. This data line logic voltage is logically inverted by the inverter gate C0 so that the inverted logic voltage at the node N8 identifies the inverted logic value of that identified by the data line logic voltage. Then, the inverted logic voltage at the node N8 is logically inverted by the inverter gate C0 to the data line logic voltage. Since the latching transfer gate TR5 is turned on, this data line logic voltage is passed to the node N4. From there, it is passed onto the node N6 in the same way as was the sensed logic voltage discussed earlier, but without biasing of the node N4.

Then, when another data word is to be read from the memory block, the memory block control signals BLK and BLKB will be respectively high and low so that the output transfer gate TR2 will be turned on. However, since the sensing signals LEQS and LEQSB will still be respectively high and low and indicate that equalization is occuring, the latching loop 116 will still couple the output terminal DQ and the node N4 so that the data line logic voltage at the output terminal DQ will be latched. This prevents false transitions or glitches from occurring on this data line when a data word is to be read from the data block during equalization and before sensing occurs.

Finally, while the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A driver circuit for driving a sensed logic voltage sensed by a sensing amplifier of a memory onto a data line of the memory in response to first complementary sensing signals and second complementary sensing signals that indicate whether sensing or equalization is occuring in the sensing amplifier, the second complementary sensing signals being delayed versions of the first complementary sensing signals, the driver circuit comprising:

an input terminal for coupling to the sensing amplifier to receive the sensed logic voltage;

an output terminal for coupling to the data line;

a first node and a second node;

an input transfer gate that is coupled between the input terminal and the first node and is responsive to the second complementary sensing signals, the input transfer gate coupling the input terminal and the first node together and passing the sensed logic voltage from the input terminal to the first node when the second complementary sensing signals indicate that sensing is occurring, the input transfer gate de-coupling the input terminal and the first node when the second complementary sensing signals indicate that equalization is occurring;

a biasing inverter gate coupled between the first and second nodes;

a transfer loop that is coupled in parallel to the biasing inverter gate between the first and second nodes and is responsive to the first complementary sensing signals and at least one of the second complementary sensing signals, the transfer loop directly coupling the first and second nodes together so that the biasing inverter gate biases the first node to a bias voltage when the first complementary sensing signals indicate that sensing is occurring and the at least one of the second complementary sensing signals still indicates that equalization is occurring, the transfer loop de-coupling the first and second nodes so that a minimal voltage swing from the bias voltage to a passed logic voltage occurs at the first node and the biasing inverter gate inverts the passed logic voltage at the first node to an inverted logic voltage at the second node when the first complementary sensing signals and the at least one of the second complementary sensing signals indicates that sensing is occurring;

a driving inverter gate that is coupled between the second node and the output terminal and inverts the inverted logic voltage at the second node back to the sensed logic voltage at the output terminal to drive the sensed logic voltage onto the data line.

2. The driver circuit of claim 1 wherein the transfer loop comprises:

a third node;

a first loop transfer gate that is coupled between the second and third nodes and is responsive to the first complementary sensing signals;

a second loop transfer gate that is coupled between the first and third nodes and is responsive to the at least one of the second complementary sensing signals;

the first loop transfer gate coupling the second and third nodes together when the first complementary sensing signals indicate that sensing is occurring and the second loop transfer gate coupling the first and third nodes together when the at least one of the second complementary sensing signals indicates that equalization is still occurring so that the first and second nodes are direcity coupled together;

the second loop transfer gate de-coupling the first and third nodes when the at least one of the second complementary sensing signals indicates that sensing is occurring so that the first and second nodes are de-coupled.

3. The driver circuit of claim 2 wherein the second loop transfer gate of the transfer loop is a full transfer gate and is responsive to both of the second complementary sensing signals.

4. The driver circuit of claim 2 wherein the second loop transfer gate of the transfer loop is a half transfer gate and is responsive to only one of the second complementary sensing signals.

5. The driver circuit of claim 1 wherein the biasing inverter gate comprises a P transistor and an N transistor and the bias voltage is based on the ratio of the sizes of the P and N transistors.

6. A driver circuit for driving a sensed logic voltage sensed by a sensing amplifier of a memory block of a memory onto a data line of the memory in response to first complementary sensing signals, second complementary sensing signals, and memory block control signals, the first and second complementary sensing signals indicating whether sensing or equalization is occuring in the sensing amplifier, the second complementary sensing signals being delayed versions of the first complementary sensing signals, the memory block control signals indicating whether or not a data word is being read from the memory, the driver circuit comprising:

an input terminal for coupling to the sensing amplifier to receive the sensed logic voltage;

an output terminal for coupling to the data line;

a first node, a second node, and a third node;

an input transfer gate that is coupled between the input terminal and the first node and is responsive to the second complementary sensing signals;

a first inverter gate that is coupled between the first and second nodes;

a second inverter gate that is coupled between the second and third nodes;

an output transfer gate that is coupled between the third node and the output terminal and is responsive to the memory block control signals; and a latching loop that is coupled between the output terminal and the first node and is responsive to the first complementary sensing signals;

when the first and second complementary sensing signals indicate that equalization is occuring and the memory block control signals indicate that the data word is being read from the memory block, the input transfer gate de-couples the input terminal and the first node, the latching loop couples the output terminal to the first node and passes a data line logic voltage at the output terminal and on the data line to the first node, the first inverter gate inverts the data line logic voltage at the first node to an inverted logic voltage at the second node, the second inverter gate inverts the inverted logic voltage at the second node back to the data line logic voltage at the third node, the output transfer gate couples the third node and the output terminal and passes the data line logic voltage from the third node to the output terminal to latch the data line logic voltage on the data line without any false transitions or glitches occuring on the data line;

when the first and second complementary sensing signals indicate that sensing is occuring and the memory block control signals still indicate that the data word is being read from the memory block, the latching loop de-couples the output terminal and the first node, the input transfer gate couples the input terminal and the first node and passes the sensed logic voltage from the input terminal to the first node, the first inverter gate inverts the sensed logic voltage at the first node to an inverted logic voltage at the second node, the second inverter gate inverts the inverted logic voltage at the second node back to the sensed logic voltage, the output transfer gate passes the sensed logic voltage from the third node to the output terminal to drive the sensed logic voltage onto the data line.

7. The driver circuit of claim 6 wherein, when the first complementary sensing signals indicate that sensing is occuring, the second complementary sensing signals still indicate that equalization is occuring, and the memory block control signals still indicate that the data word is being read from the memory block, the latching loop de-couples the output terminal and the first node, the input transfer gate still de-couples the input terminal and the first node, and the output transfer gate still couples the third node and the output terminal.

8. The driver circuit of claim 6 wherein the latching loop comprises:

a fourth node and a fifth node;

a first loop inverter gate that is coupled between the output terminal and the fourth node;

a second loop inverter gate that is coupled between the fourth node and the fifth node;

a loop transfer gate is coupled between the fifth node and the first node;

when the first and second complementary sensing signals indicate that equalization is occurring and the memory block control signals indicate that the data word is being read from the memory block, the first loop inverter gate inverts the data line logic voltage at the output terminal to an inverted logic voltage at the fourth node, the second loop inverter gate inverts the inverted logic voltage at the fourth node back to the data line logic voltage at the fifth node, and the loop transfer gate couples the first node and the fifth node together and passes the data line logic voltage at the fifth node to the first node;

when the first and second complementary sensing signals indicate that sensing is occurring and the memory block control signals indicate that the data word is being read from the memory block, the loop transfer gate de-couples the first node and the fifth node so that the output terminal and the first node are de-coupled.

9. A driver circuit for driving a sensed logic voltage sensed by a sensing amplifier of a memory block of a memory onto a data line of the memory in response to first complementary sensing signals, second complementary sensing signals, and memory block control signals, the first and second complementary sensing signals indicating whether sensing or equalization is occurring in the sensing amplifier, the second complementary sensing signals being delayed versions of the first complementary sensing signals, the memory block control signals indicating whether or not a data word is being read from the memory, the driver circuit comprising:

an input terminal for coupling to the sensing amplifier to receive the sensed logic voltage;

an output terminal for coupling to the data line;

a first node, a second node, and a third node;

an input transfer gate that is coupled between the input terminal and the first node and is responsive to the second complementary sensing signals;

a first inverter gate that is coupled between the first and second nodes;

a transfer loop that is coupled in parallel to the first inverter gate between the first and second nodes and is responsive to the first complementary sensing signals and at least one of the second complementary sensing signals;

a second inverter gate that is coupled between the second and third nodes;

an output transfer gate that is coupled between the third node and the output terminal and is responsive to the memory block control signals; and a latching loop that is coupled between the output terminal and the first node and is responsive to the first complementary sensing signals;

when the first and second complementary sensing signals indicate that equalization is occurring and the memory block control signals indicate that the data word is being read from the memory block, the input transfer gate de-couples the input terminal and the first node, the latching loop couples the output terminal to the first node and passes the data line logic voltage at the output terminal and on the data line to the first node, the transfer loop de-couples the first and second nodes, the first inverter gate inverts a data line logic voltage at the first node to an inverted logic voltage at the second node, the second inverter gate inverts the inverted logic voltage at the second node back to the data line logic voltage at the third node, the output transfer gate couples the third node and the output terminal and passes the data line logic voltage from the third node to the output terminal to latch the data line logic voltage on the data line without any false transitions or glitches occurring on the data line;

when the first complementary sensing signals indicate that sensing is occurring, the second complementary sensing signals still indicate that equalization is occurring, and the memory block control signals still indicate that the data word is being read from the memory block, the latching loop de-couples the output terminal and the first node, the input transfer gate still de-couples the input terminal and the first node, the transfer loop directly couples the first and second nodes together so that the first inverter gate biases the first node to a bias voltage, and the output transfer gate still couples the third node and the output terminal together;

when the first and second complementary sensing signals indicate that sensing is occurring and the memory block control signals still indicate that the data word is being read from the memory block, the latching loop still de-couples the output terminal and the first node, the input transfer gate couples the input terminal and the first node together so that the sensed logic voltage is passed from the input terminal to the first node, the transfer loop de-couples the first and second nodes so that a minimal voltage swing from the bias voltage to the passed logic voltage occurs at the first node, the first inverter gate inverts the passed logic voltage at the first node to an inverted logic voltage at the second node, the second inverter gate inverts the inverted logic voltage at the second node back to the sensed logic voltage, the output transfer gate passes the sensed logic voltage from the third node to the output terminal to drive the sensed logic voltage onto the data line.

10. The driver circuit of claim 9 wherein the latching loop comprises:

a fourth node and a fifth node;

a first loop inverter gate that is coupled between the output terminal and the fourth node;

a second loop inverter gate that is coupled between the fourth node and the fifth node;

a loop transfer gate is coupled between the fifth node and the first node;

when the first and second complementary sensing signals indicate that equalization is occurring and the memory block control signals indicate that the data word is being read from the memory block, the first loop inverter gate inverts the data line logic voltage at the output terminal to an inverted logic voltage at the fourth node, the second loop inverter gate inverts the inverted logic voltage at the fourth node back to the data line logic voltage at the fifth node, and the loop transfer gate couples the first node and the fifth node together and passes the data line logic voltage at the fifth node to the first node;

when the first complementary sensing signals indicate that sensing is occurring, the second complementary sensing signals indicate that equalization or sensing is occurring, and the memory block control signals still indicate that the data word is being read from the memory block, the loop transfer gate de-couples the first node and the fifth node so that the output terminal and the first node are de-coupled.

11. The driver circuit of claim 9 wherein the transfer loop comprises:

a fourth node;

a first loop transfer gate that is coupled between the second and fourth nodes and is responsive to the first complementary sensing signals;

a second loop transfer gate that is coupled between the first and fourth nodes and is responsive to the at least one of the second complementary sensing signals;

when the first complementary sensing signals indicate that sensing is occurring, the second complementary sensing signals still indicate that equalization is occurring, and the memory block control signals still indicate that the data word is being read from the memory block, the first loop transfer gate couples the second and fourth nodes together and the second loop transfer gate coupling the first and third nodes together so that the first and second nodes are coupled together;

when the first and second complementary sensing signals indicate that sensing is occurring and the memory block control signals still indicate that the data word is being read from the memory block, the second loop transfer gate de-couples the first and fourth nodes so that the first and second nodes are de-coupled.

12. The driver circuit of claim 11 wherein the second loop transfer gate of the transfer loop is a full transfer gate and is responsive to both of the second complementary sensing signals.

13. The driver circuit of claim 11 wherein the second loop transfer gate of the transfer loop is a half transfer gate and is responsive to only one of the second complementary sensing signals.

14. The driver circuit of claim 9 wherein the first inverter gate comprises a P transistor and an N transistor and the bias voltage is based on the ratio of the sizes of the P and N transistors.

* * * * *